(12) United States Patent
Krassnitzer et al.

(10) Patent No.: US 11,264,216 B2
(45) Date of Patent: Mar. 1, 2022

(54) MODIFIABLE MAGNET CONFIGURATION FOR ARC VAPORIZATION SOURCES

(75) Inventors: Siegfried Krassnitzer, Feldkirch (AT); Juerg Hagmann, Sax (CH); Oliver Gstoehl, Balzers (LI)

(73) Assignee: OERLIKON SURFACE SOLUTIONS AG, PFÄFFIKON, Pfäffikon SZ (CH)

( * ) Notice: Subject to any disclaimer, the term of this patent is extended or adjusted under 35 U.S.C. 154(b) by 84 days.

(21) Appl. No.: 13/148,384

(22) PCT Filed: Dec. 30, 2009

(86) PCT No.: PCT/EP2009/009319
§ 371 (c)(1),
(2), (4) Date: Aug. 8, 2011

(87) PCT Pub. No.: WO2010/088947
PCT Pub. Date: Aug. 12, 2010

(65) Prior Publication Data
US 2011/0308941 A1    Dec. 22, 2011

(30) Foreign Application Priority Data

Feb. 9, 2009    (DE) .................... 10 2009 008 161.5

(51) Int. Cl.
*H01J 37/32* (2006.01)
*H01J 37/34* (2006.01)
*C23C 14/32* (2006.01)

(52) U.S. Cl.
CPC ........ *H01J 37/3266* (2013.01); *C23C 14/325* (2013.01); *H01J 37/32055* (2013.01);
(Continued)

(58) Field of Classification Search
CPC ............ H01J 37/3408; H01J 37/32055; H01J 37/3455; H01J 37/3458; H01J 37/3266; H01J 37/32669; C23C 14/325
(Continued)

(56) References Cited

U.S. PATENT DOCUMENTS

| 3,836,451 A | * | 9/1974 | Snaper | ................... C23C 14/325 |
| | | | | 204/298.41 |
| 4,401,539 A | * | 8/1983 | Abe | ..................... H01J 37/3408 |
| | | | | 204/192.1 |

(Continued)

FOREIGN PATENT DOCUMENTS

| DE | 19702928 A1 * | 7/1998 | ........... C23C 14/325 |
| DE | 10127012 A1 | 12/2002 | |

(Continued)

OTHER PUBLICATIONS

Abstract of JP0143713a.*
International Search Report for PCT/EP2009/009319 dated Feb. 19, 2010.

*Primary Examiner* — Michael A Band
(74) *Attorney, Agent, or Firm* — Pearne & Gordon LLP

(57) ABSTRACT

The present invention relates to an arc vaporization source for generating hard surface coatings on tools. The invention comprises an arc-vaporization source, comprising at least one electric solenoid and a permanent magnet arrangement that is displaceable relative to the target surface. The vaporization source can be adjusted to the different requirements of oxide, nitride, or metal coatings. The rate drop during the lifespan of a target to be vaporized can be held constant or adjusted by suitably adjusting the distance of the permanent magnets to the front side of the target. A compromise between the coating roughness and rate can be set.

14 Claims, 15 Drawing Sheets

Figure 6:
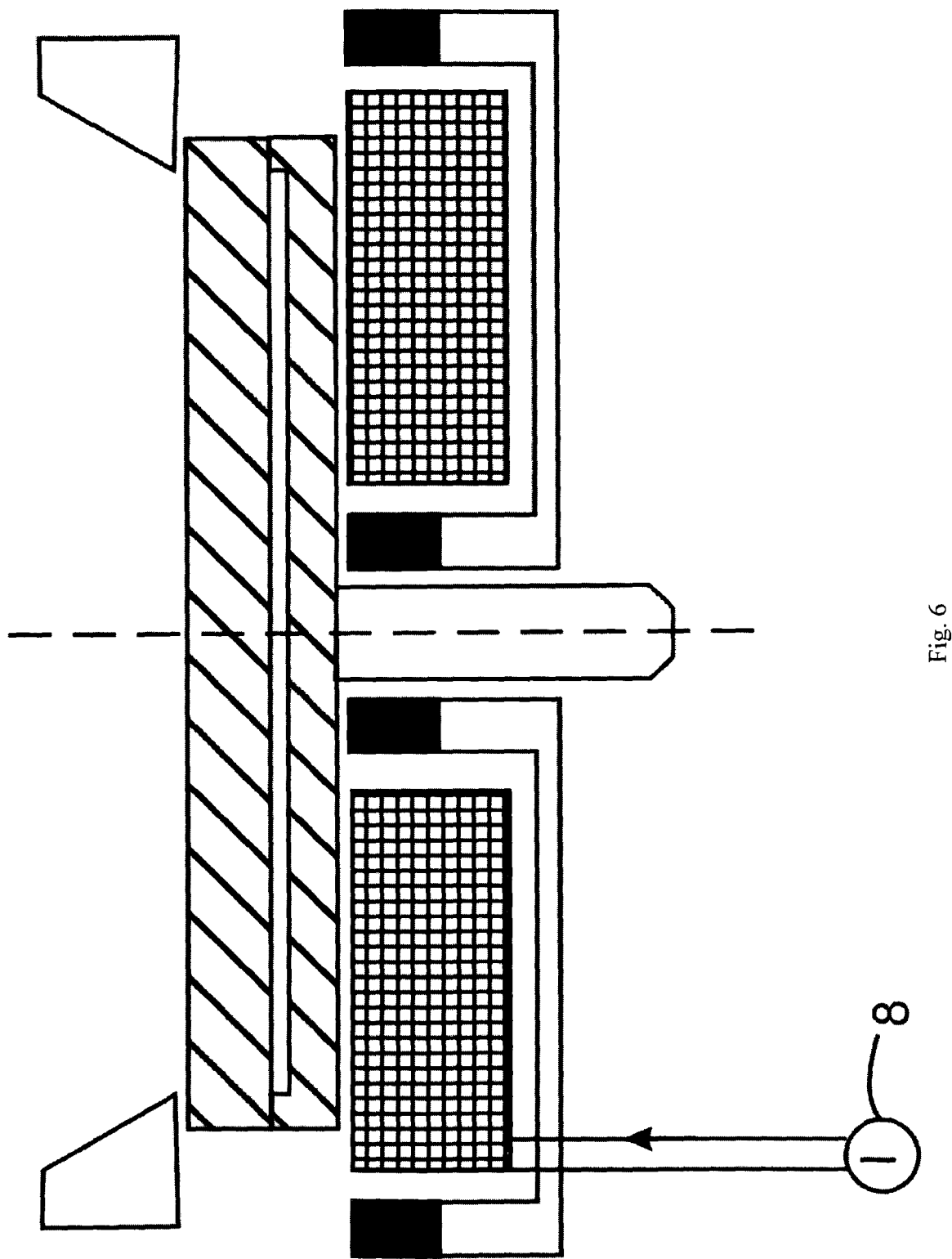

(52) U.S. Cl.
CPC .... *H01J 37/32669* (2013.01); *H01J 37/3455* (2013.01); *H01J 37/3458* (2013.01)

(58) Field of Classification Search
USPC .................................................. 204/298.41
See application file for complete search history.

(56) References Cited

U.S. PATENT DOCUMENTS

| | | | |
|---|---|---|---|
| 5,160,595 A * | 11/1992 | Hauzer et al. ........... | 204/192.38 |
| 5,298,136 A * | 3/1994 | Ramalingam ..... | H01J 37/32055 |
| | | | 204/192.38 |
| 6,413,387 B1 * | 7/2002 | Shi ........................ | C23C 14/325 |
| | | | 204/192.38 |
| 2006/0065525 A1 * | 3/2006 | Weichart .................. | 204/298.28 |
| 2008/0020138 A1 | 1/2008 | Ramm et al. | |
| 2009/0050059 A1 * | 2/2009 | Goikoetxea Larrinaga .. | 118/726 |
| 2009/0205949 A1 * | 8/2009 | Zueger .................... | 204/298.16 |

FOREIGN PATENT DOCUMENTS

| | | | | |
|---|---|---|---|---|
| DE | 10127013 A1 | 12/2002 | | |
| EP | 0459137 A2 | 12/1991 | | |
| EP | 1970464 A1 | 9/2008 | | |
| JP | 09143713 A * | 6/1997 | ............. | C23C 14/35 |
| WO | 2004/057642 A2 | 7/2004 | | |
| WO | WO 2007068768 A1 * | 6/2007 | ............. | C23C 14/24 |
| WO | 2007/131944 A2 | 11/2007 | | |

* cited by examiner

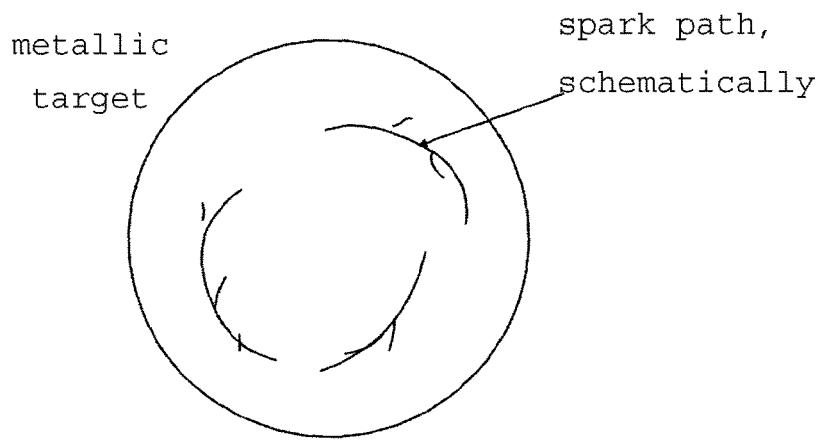
Fig. 1 metallic spark
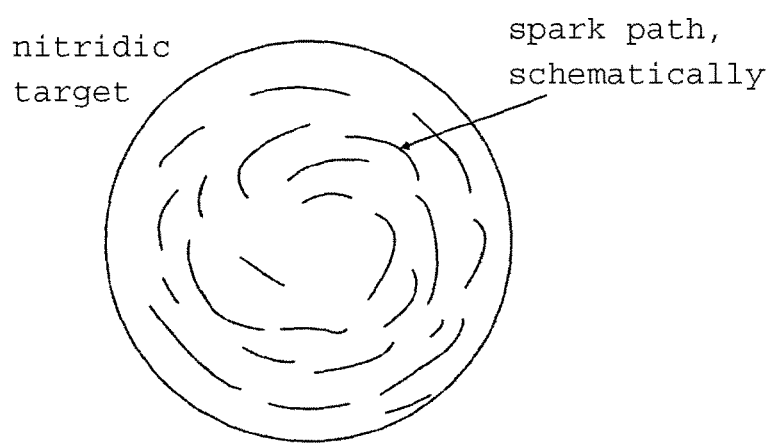
Fig. 2 nitridic spark
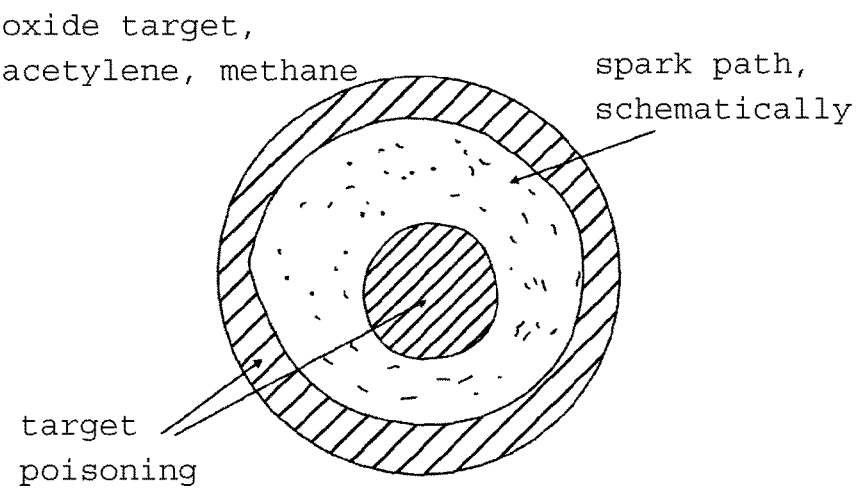
Fig. 3 oxidic spark

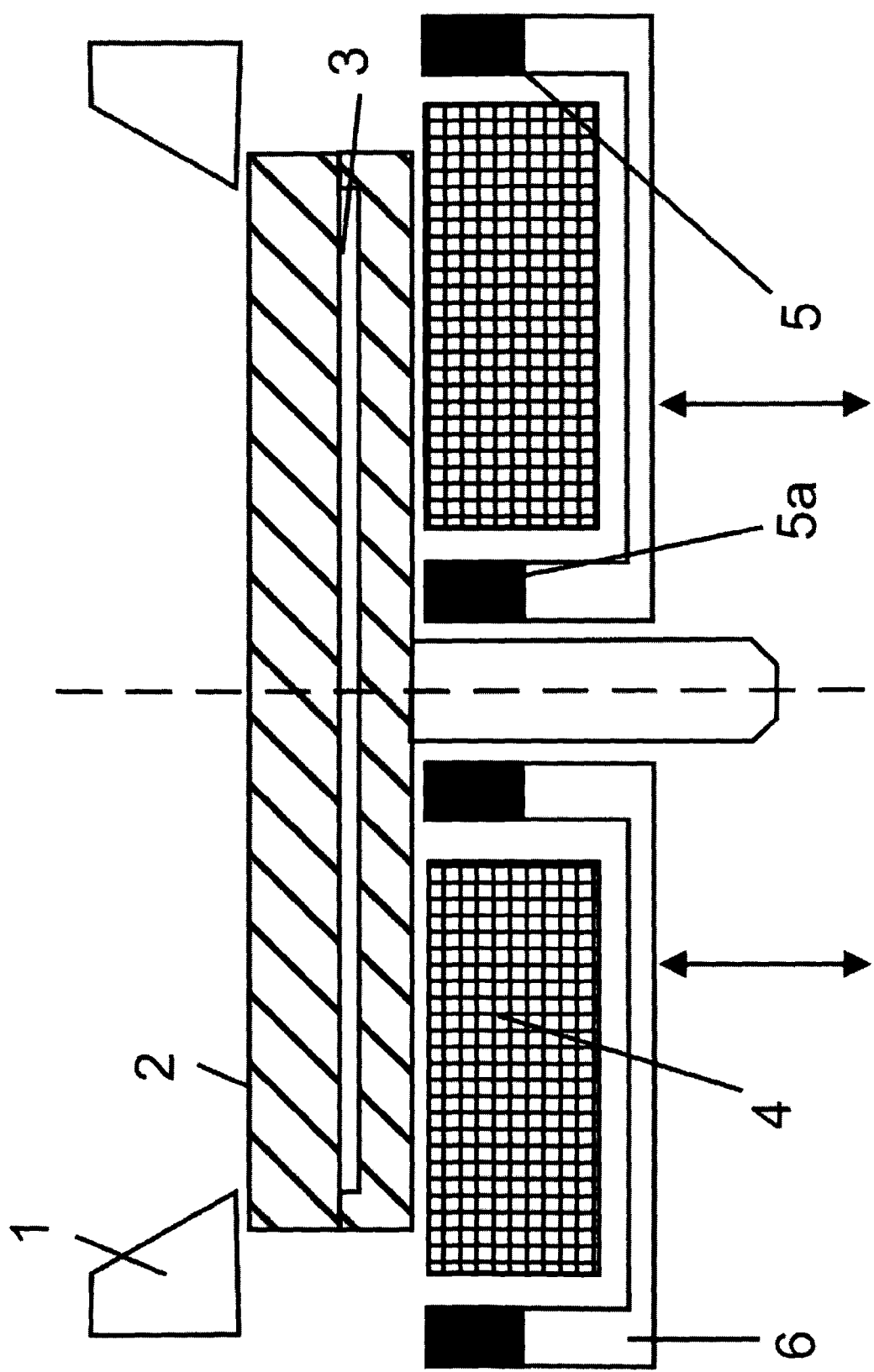
Fig. 4 Representation of the inventive magnet system

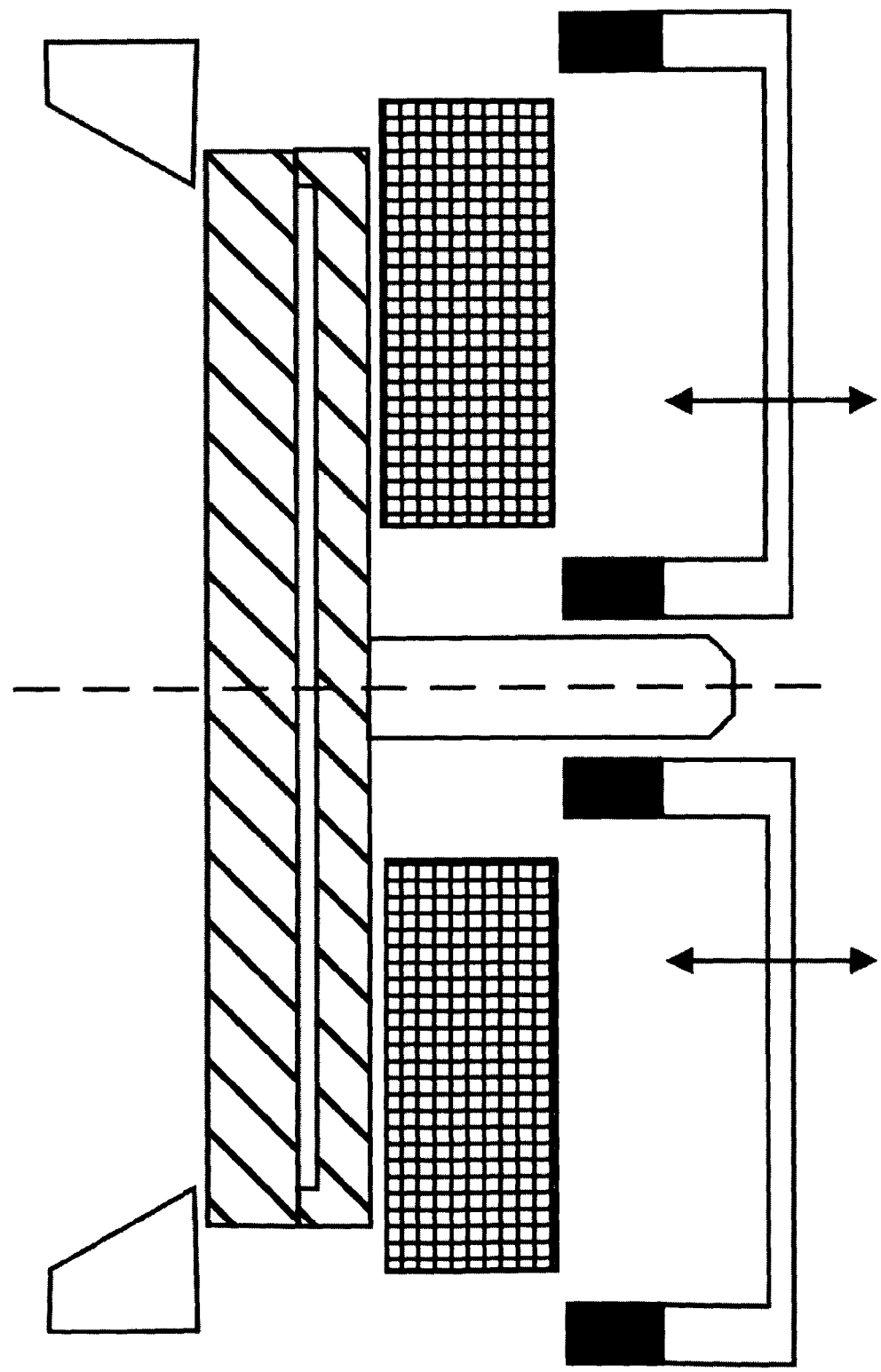
Fig. 5 Magnet system in withdrawn position

MODIFIABLE MAGNET CONFIGURATION FOR ARC VAPORIZATION SOURCES

The present invention relates to a magnet system for an arc-vaporization source for use in coating processes with strongly reactive gases, weakly reactive gases and without reactive gases.

The present invention further relates to a magnet system for an arc-vaporization source that maintains the vaporization rate constant throughout the target's entire lifespan and also allows the rate and droplet emission to be optimally adjusted.

A typical PVD coating installation operating by means of arc evaporation includes a vacuum chamber connected to a pumping unit that generates, in the installation, the vacuum required for the process. Substrate holders in the vacuum chamber serve to accommodate the substrates (tools or building elements or other components) and to hold the latter during pre-treatment and coating. The substrate holders and thus the substrates themselves can be placed on a fixture by means of a substrate bias power supply during treatment and in particular during coating, so as to be exposed either to ion bombardment (negative voltage) or electron bombardment (positive voltage). The substrate bias power supply can be a DC, AC or bipolar respectively unipolar substrate power supply.

The coating is performed by means of spark sources. These spark sources comprise a target whose material is vaporized by means of the sparks. A source magnet field generated by the magnetic means determines whether a spark is steered on a specific path (so-called "steered arc"), in order for instance to reduce sputtering, or whether the spark can move more or less freely on the target surface (so-called "random arc"), which usually results in a better target use and a higher vaporization rate.

This means that magnet systems are used for moving the spark on the target. The so-called ARC steering by means of specially directed magnet fields enable both the speed of the spark to be influenced as well as the spark path on the target surface to be defined, in order to achieve as good a volume use of the target as possible.

As indicated in the "handbook of vacuum ARC science and technology" by Boxman et al., chapter 3 "Cathode Spots", different types of ARC spots and their movements can be distinguished. In principle, depending on the reactivity of the gas, the following observation can be made:

a) Arc vaporization in vacuum or with inert gas such as e.g. argon

The spark travels relatively slowly on the paths prescribed by the magnetic field, said paths being mainly circular in the case of round targets. The proportion of random movement is rather low. The vaporization rates are relatively high in this case. An emission of relatively large droplets occurs during this vaporization. The speed of the spark and its "path diameter" on the target can be adjusted by means of the magnetic field. This is called, in this process, metallic spark. FIG. 1 shows by way of example a corresponding path.

b) Arc vaporization in weakly reactive gases such as e.g. nitrogen

Nitrogen reacts on the target surface and forms a nitride layer of several atom layers. An increase of the spark speed can be observed in this case.

A further increase of the spark speed can be achieved through stronger magnetic fields running parallel to the target surface. The droplets emitted are in this case advantageously smaller. It is generally possible to generate homogenous conditions relative to the surface reactivity, i.e. stable adjustments of the vaporization rate and of the reaction rate of the nitrogen on the target surface.

Due to the relatively high conductivity of the nitrides, spark erosion can also occur on a nitrided surface. Consequently, this will also lead to a net removal of material, i.e. there is no formation of permanently coated areas causing target poisoning. FIG. 2 shows a corresponding progression.

c) Arc vaporization in strongly reactive gases such as e.g. oxygen or acetylene, methane In this case, there is a strong reaction of the reactive gas with the target surface. This normally leads, for example with the use of oxygen, to electrically insulating layers. In order to maintain stable conditions, it is important that a net vaporization be sustained on the entire target surface. Areas with low local vaporization rate become insulating and are thus even further excluded from vaporization. The target surface becomes "poisoned", this process being generally progressive, and in the end only a small surface portion on the target bears the spark discharge. This causes, especially when using highly magnetic field strengths with a large radial component in order to increase the spark speed and thus reduce the droplet size, to a strong inhomogeneity of the local vaporization rate and thus to a faster poisoning of further areas of the target.

As mentioned in US2008020138A1 (J. Ramm et al.), a stable vaporization of AlCr-oxide for example is only possible if the magnetic field is smaller than a maximum field strength or if no magnetic field at all is used. When using strong magnetic fields, the magnet field distribution parallel to the target surface is naturally very inhomogeneous and therefore areas that have an insulating layer will quickly develop on the target surface. The corresponding spark behavior is represented diagrammatically in FIG. 3.

As discussed further above, it is possible to generate with one and the same metallic target different layers, for example by coating with inert gases, weakly reactive gases or strongly reactive gases. The inert gas will not bind with the target material whilst the reactive gases will lead to conductive or insulating layers on the target surface. In order to maintain a stable coating process, it is advantageous to create a distribution of the magnetic field line adapted to each of these cases on and above the target surface that will each time influence the spark path as to its course and speed.

Several options known in the state of the art will allow a magnetic field line to be distributed on and above the target surface. This is for example possible with permanent magnets and/or with electromagnets and/or their combination.

Furthermore, it is known in the state of the art how to place several displaceable magnetic field arrangements opposite the target surface so that on the basis of the achieved ability of the arc paths to be displaced, a regular erosion of target material can be achieved. Curtins accordingly discloses in DE10127012A1 an arrangement of the magnetic field that has a holder, from which a ring/solenoid coil as well as a permanent magnet extend. In order to adjust an efficient magnetic field on the surface of the target in the area of the arc spot by means of the magnetic field arrangement, i.e. by means of the magnetic fields generated by the ring coil and the permanent magnet, such that the arc resp. spot can coat the entire surface of the target in defined paths, with the consequence that a regular erosion of target material occurs, the magnetic field arrangement can be adjusted as a unit on the target and this in a plane running parallel to the target surface. Furthermore, the unit can if necessary be placed at a desired distance to the target, i.e. it can be subjected to a displacement in the direction Z.

Figure 16:
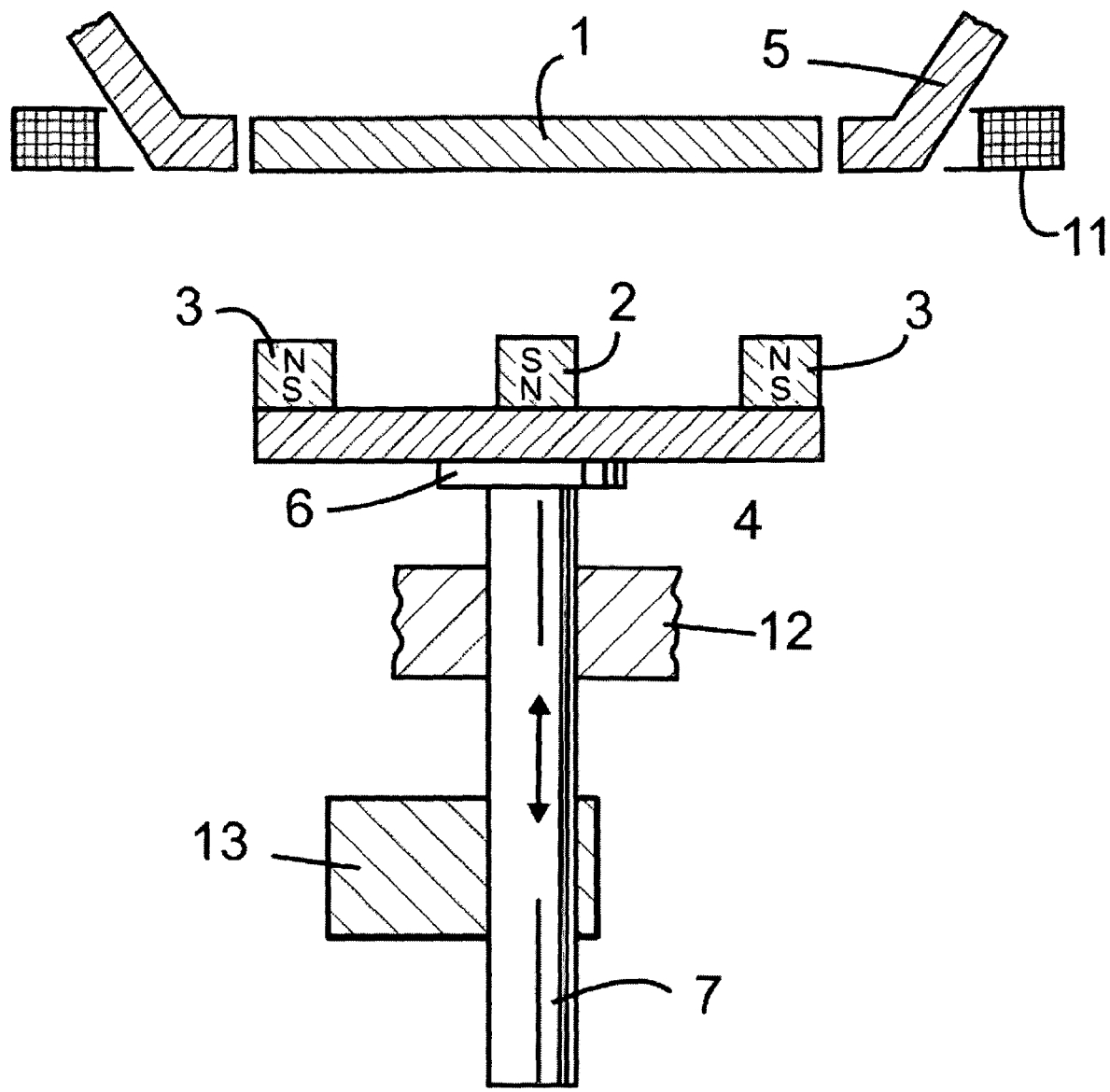

EP00459137B1 discloses a magnetic field arrangement with a center pole permanent magnet and marginal permanent magnet, which can both be displaced axially, i.e. perpendicularly to the target surface. Additionally, an electromagnetic ring coil is provided in the area of the target that can be steered in such a way when the arc discharges that it influences the arc trail that is forming and thus contributes to increasing the target's standing time. In EP00459137B1, the target lies in the inside space of the ring coil. The target surface and the coil end lie essentially in one plane according to FIG. 2 of EP00459137B1 (see FIG. 16 of this application).

Accordingly, the coil includes the target and also parts of the wall of the vacuum chamber called receptacle. This makes it possible to prevent the magnetic fields generated by the coil from exerting radial components onto the surface of the target. Such a vertical coil field thus has no influence on the speed with which the arc spot travels over the target surface.

In contrast thereto, it would be advantageous to have a magnetic field arrangement that, because of the field line course at the edge of the target, would lead to a greater speed and thus to a lower resting time. This would lead to a target with integrated means for generating magnetic fields with which a spark vaporization would be possible efficiently both with strongly reactive as well as with weakly reactive and also inert gases.

According to the invention, the task is solved by means of a magnetic field arrangement comprising marginal permanent magnets and at least one ring coil, wherein the marginal permanent magnets can be displaced away from the target essentially perpendicularly to the surface of the target and the projection of the marginal permanent magnets onto the target surface is further away from the middle of the target surface by comparison to the projection of the ring coil onto the target surface. In so doing, the ring coil is placed behind the target and has an inner diameter defined by the windings that is not essentially larger and is preferably smaller than or equal to the diameter of the target.

The inventors have observed that with the marginal permanent magnets being moved away from the target and the coil current being switched on, the coating process runs in a considerably more stable manner than with a coil arrangement according to FIG. 2 of EP00459137B1. This may be linked to the fact that such an arrangement achieves that the field lines of the magnetic field induced by the current-carrying coils comprise in the central area of the target surface essentially no radial component, while they comprise radial components in the marginal area of the target surface.

Figure 17:
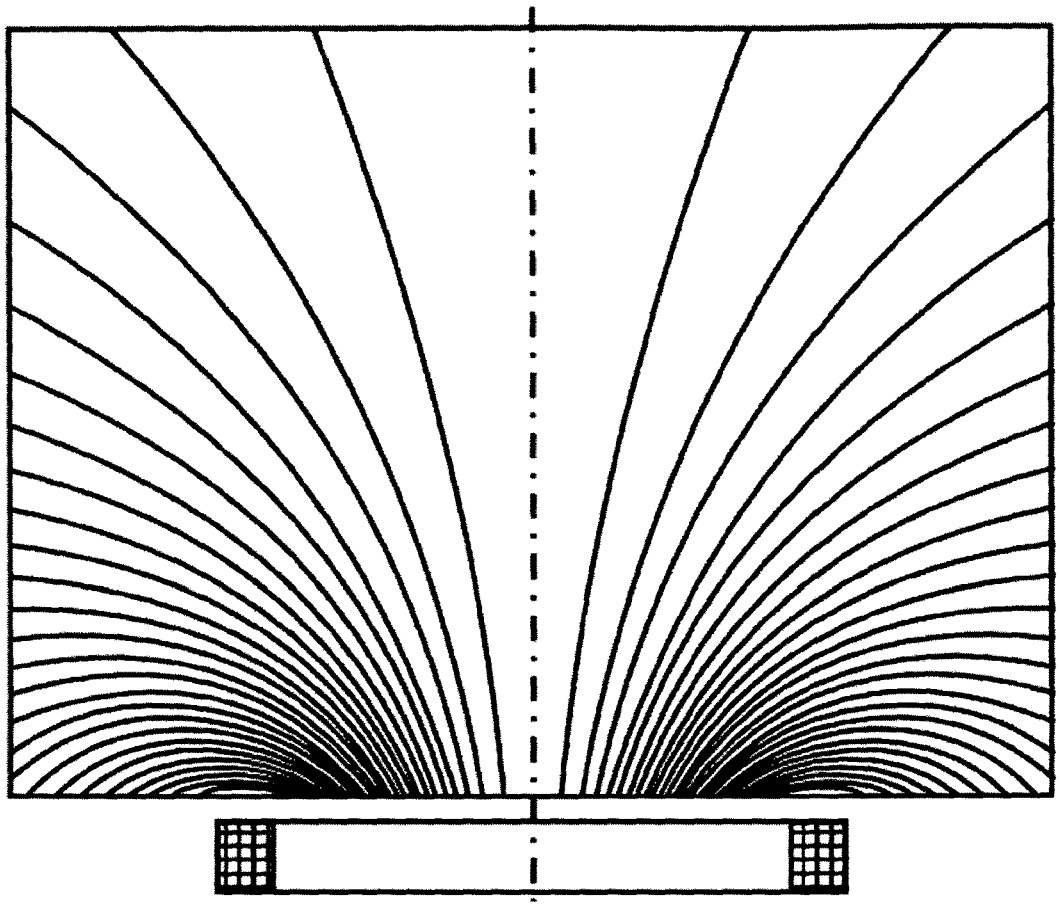
Figure 18:
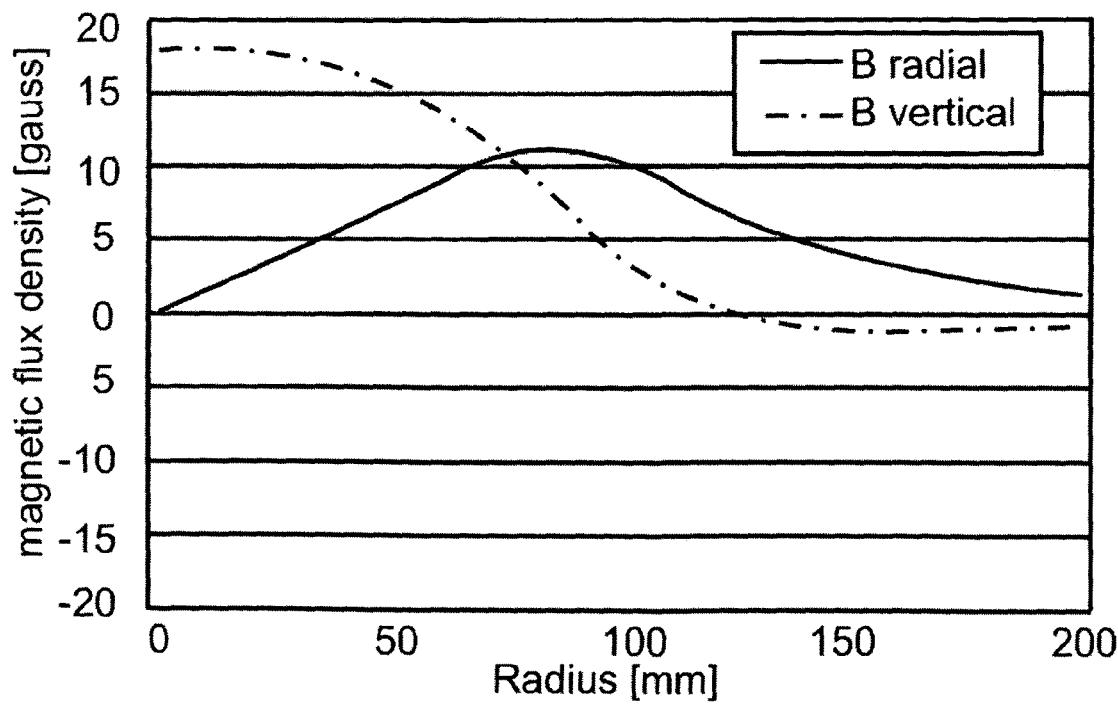

For clarification, the magnetic field generated in a coil (or more accurately the progress of the magnetic field lines) is illustrated schematically in FIG. 17 and, in FIG. 18, the axial component and the radial component are represented as a function of the distance from the coil axis just above the coil end.

According to a further aspect of the present invention, the magnetic field arrangement further comprises a central permanent magnet, wherein the projection of the inside of the ring coil onto the target surface is further away from the middle of the target surface as compared with the projection of the central permanent magnet onto the target surface, and the central permanent magnet can be displaced away from the target essentially perpendicularly to the surface of the target.

Hereinafter, the invention will be described more closely by means of examples and with the aid of the figures. FIG. 4 shows a target with a magnet system according to a first embodiment.

The magnetic field, as shown in FIG. 4, is generated by a permanently arranged coil (4) and by a permanent magnet arrangement (5, 5a). The magnet arrangement with a magnet receptacle (6) can be displaced in the axial direction, away from the target. This ability to be displaced is shown in FIG. 5.

The following basic settings result for the above described magnet system.

Setting 1, as shown schematically in FIG. 6:

The permanent magnet takes up the position in which its poles are closest to the coating material (position "in front"). Preferably, a coil end and a pole are essentially in one plane in this setting. The coil current is switched on. It can be both positive as well as negative (8) and can also be modulated. This setting generates a strong magnetic field of about 60-100 Gauss. This setting is thus suitable for example for the vaporization of nitride layers. Thanks to the high magnetic field strength and the latter's radial component, the spark moves fast. This results in smooth layers. With the magnetic field of the coil, which is superimposed over the field of the permanent magnets, the course of the field lines and thus the path of the spark are influenced. Preferably, the coil current is time-modulated and thus a propagation of the erosion pit reached.

With such a setting it is possible to generate hard material layers such as for example TiN, TiAlN, AlTiN, AlCRN, TiSiN.

Figure 7:
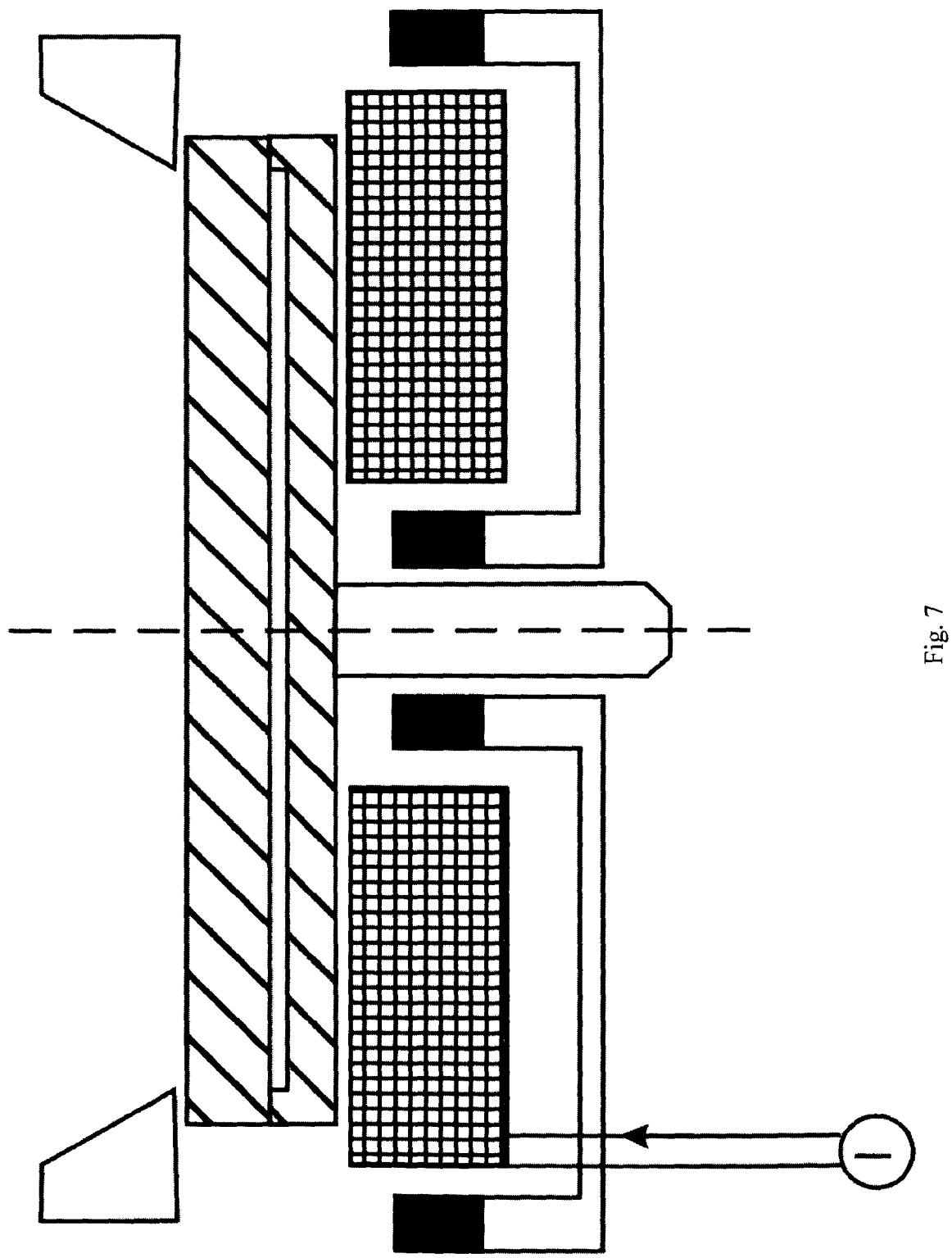

Setting 2, as shown in FIG. 7:

The permanent magnet (5, 5a, 6) is "moved back" by 5-50 mm, i.e. at a further distance from the target surface than in setting 1. The coil current is then switched on and can be positive or negative as well also as modulated.

This setting generates gradually, depending on the displacement, a magnetic field of 10-40 Gauss including a superimposed coil field. It allows on the one hand the vaporization rate to be increased with the increasing displacement, though a coarser layer with larger droplets must be expected. On the other hand, by displacing the magnet arrangement (5, 5a, 6), it is possible to establish a balance between target poisoning and erosion rate at many points of the target surface. Through this, the coating process can be considerably stabilized.

This setting is suitable both for generating nitride layers at a high coating rate such as TiN, TiAlN, AlTiN, TiSiN as well as for generating carbo-nitrides or carbides using gases such as acetylene or methane. It is however especially suited for producing various oxide layers such as for example Al2O3, ZrO, TiO2 or their mixes depending on the target's starting material.

Figure 8:
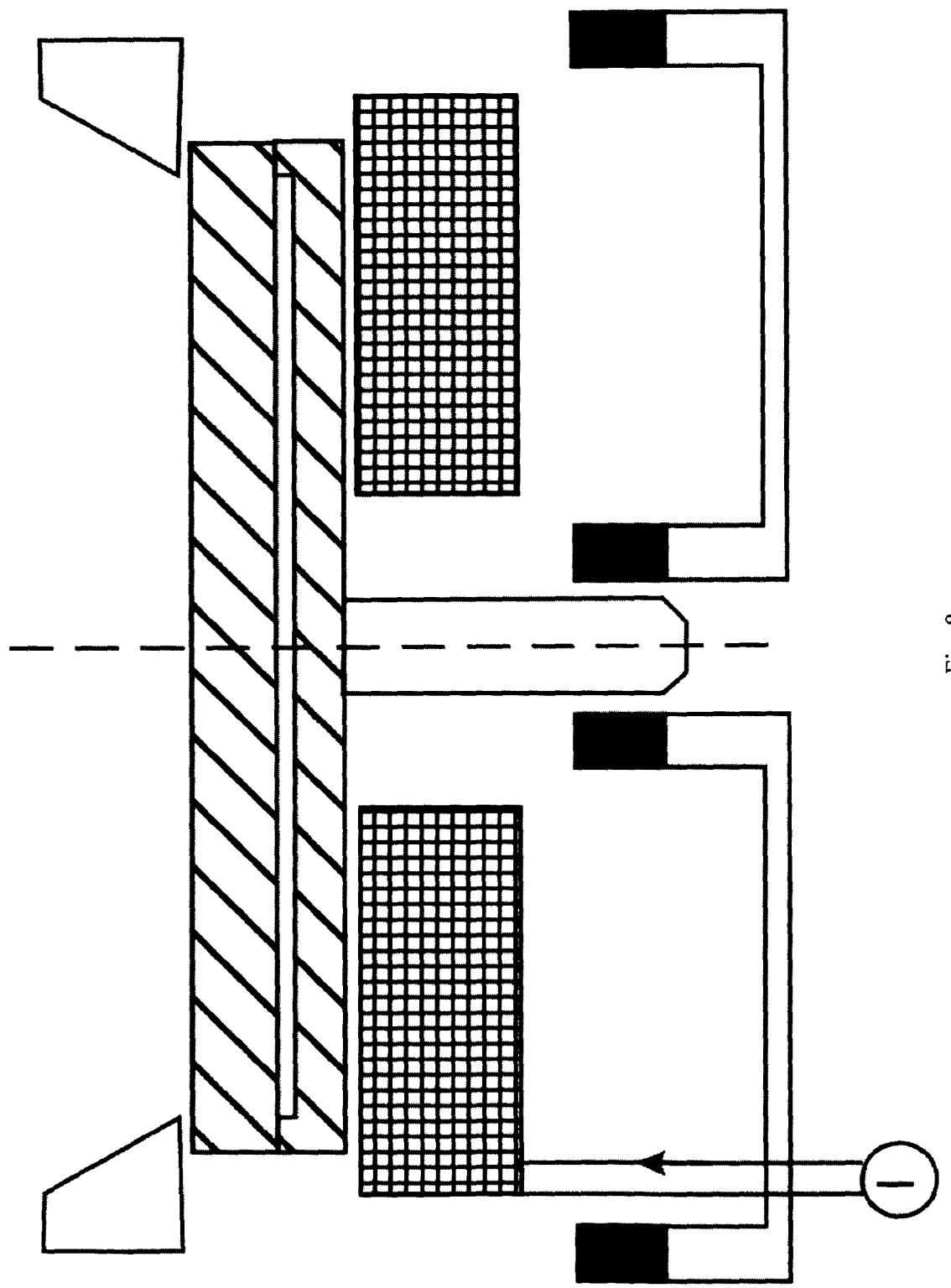

Setting 3, as shown in FIG. 8:

In this setting, the permanent magnet is withdrawn by more than 50 mm, i.e. it is totally separated from the coil. The coil field, positive or negative and/or possibly modulated, is then switched on. The magnetic field component of the permanent magnet arrangement is however negligibly small. Depending on the current strength, the coil field is approximately 5-15 Gauss.

This setting is suitable for depositing metallic layers and/or nitride, carbo-nitride, carbide and/or oxide layers. As already discussed further above, the rule is that for highly reactive gases, the coil's magnetic field should not be too high (maximum about 10 Gauss). Thus it is possible to operate the ARC vaporization without poisoning of target areas.

Figure 9:
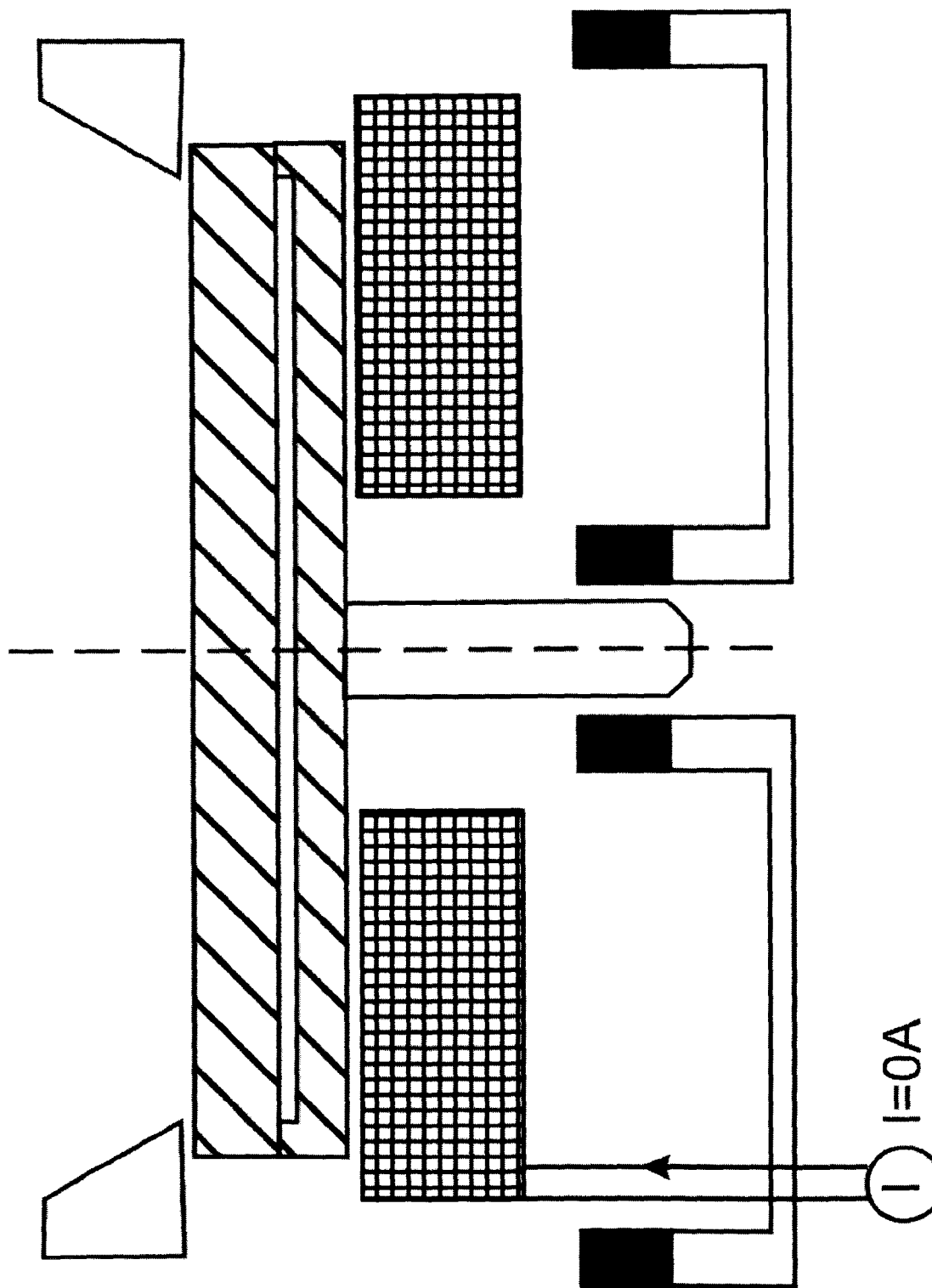

Setting 4, as shown in FIG. 9:

The permanent magnet is moved back by more than 50 mm, the coil current is switched off. In this setting, no magnetic fields to speak of are present on the target surface. The ARC source operates in so-called random mode. This is particularly advantageous in the case of highly reactive gases such as oxygen. The spark of the ARC discharge in this case travels in random fashion with very many ARC spots over the target. The discharge occurs in a very stable manner and no areas with target poisoning can appear.

If this magnet setting however operates metallically (without reactive gas or in high vacuum) or nitridically, a very high vaporization rate with very high droplet proportion will be observed.

The figures show that all source positions can be implemented in a vacuum chamber with the same target. This means it is possible to optimally adapt the magnetic field to the requirements in the same coating process by changing the position of the magnets according to FIGS. 6 to 9 for generating at will metallic, nitride, carbo-nitride, carbide or oxide layers. No source position needs to be reserved exclusively for each type of layer. This allows coating processes with high productivity to be achieved.

In this manner, with one and the same AlCr target (70%:30%) the following layer system was coated in three steps:
1) a metallic bonding layer with the setting 1; it must be noted in this case that the erosion of the target was optimized by wobbling the coil;
2) an AlCrN as first hard layer with the setting 2;
3) an AlCryOx as second hard layer with the setting 3.

In a second example, a Ti-target was used. Again, a metallic bonding layer was first applied using setting 1. Additionally, by wobbling the coil, the erosion of the target was optimized. Then a TiCN layer was applied using setting 2 and finally a TiN layer using setting 3.

According to a further aspect of the present invention, a magnet system for an arc vaporization source is disclosed, with which the vaporization rate is maintained constant throughout the target's entire lifespan. Furthermore, this allows the rate and droplet emission to be adjusted optimally.

The vaporization rate of an ARC source is very much determined among others by the magnetic field parallel to the target surface. A stronger magnetic field increases the speed of the spark and thus reduces the vaporization rate with simultaneous deposition of smoother layers. As the target erosion increases, the target surface moves ever closer to the magnet system lying behind it, which results in a strong increase of the magnetic field strength and in a falling coating rate. The present inventive magnet system can compensate for the changes in the distance from the target surface to the magnet system by displacing the permanent magnet arrangement, and a constant vaporization rate throughout the target's total useful life can be ensured.

The distance of the target surface to the magnet system essentially determines the magnetic field strength and thus the rate of vaporization. For a new, unused target, the distance will be maximum and thus the magnetic field smallest. An erosion during the coating process leads to a successive reduction of the distance of the target surface to the magnet system and thus to an increase of the magnetic field strength and a falling rate. This is shown with the aid of FIG. 10, data line with circular symbols.

Figure 10:
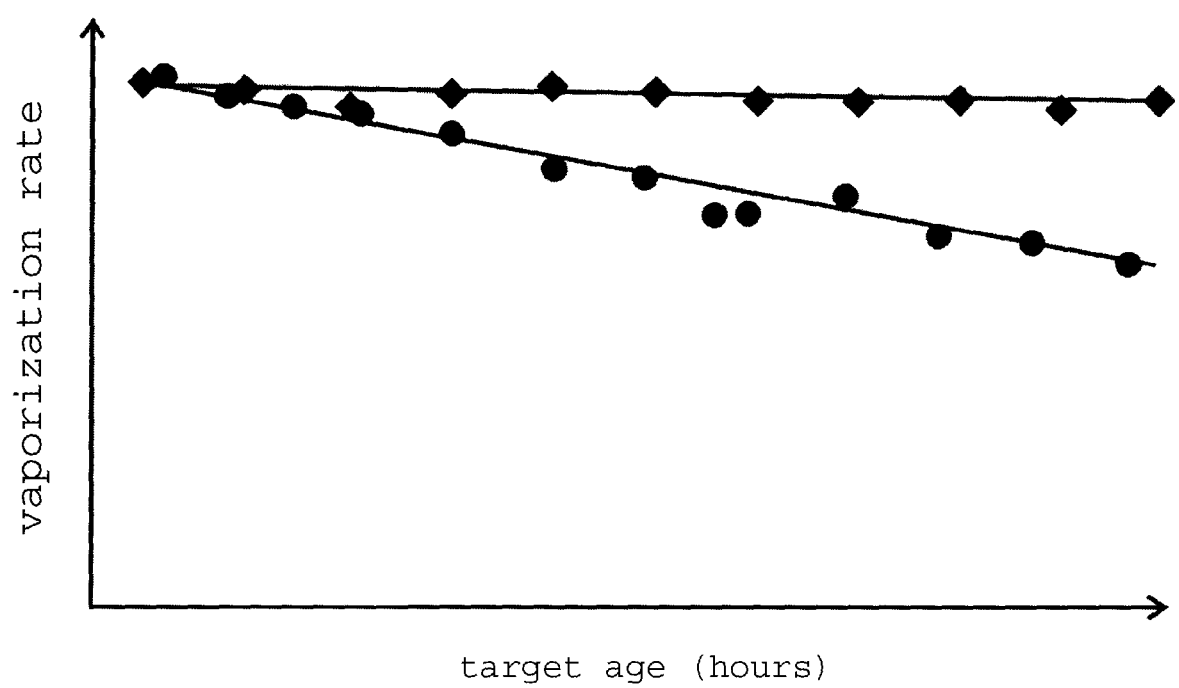
Figure 11:
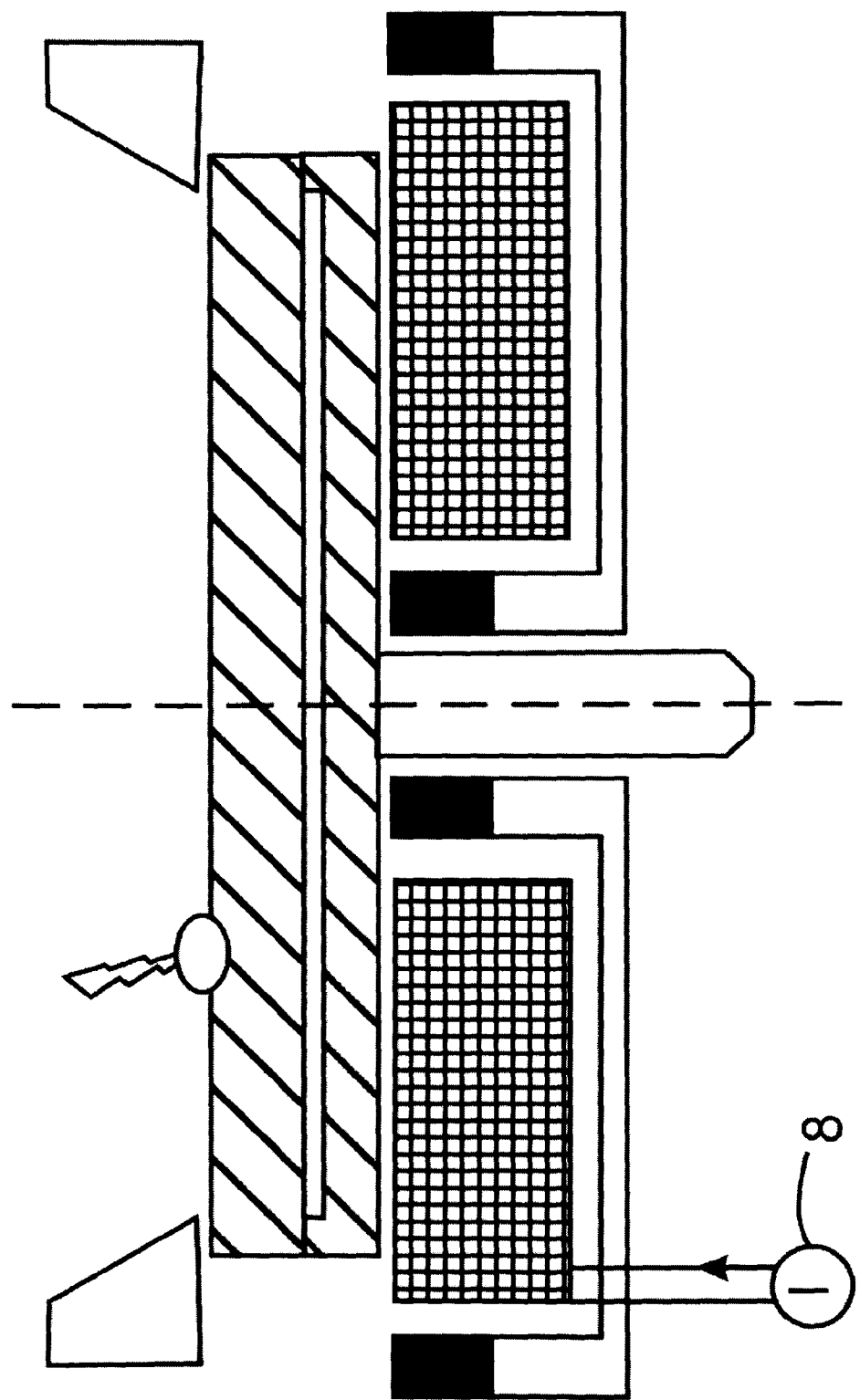
Figure 12:
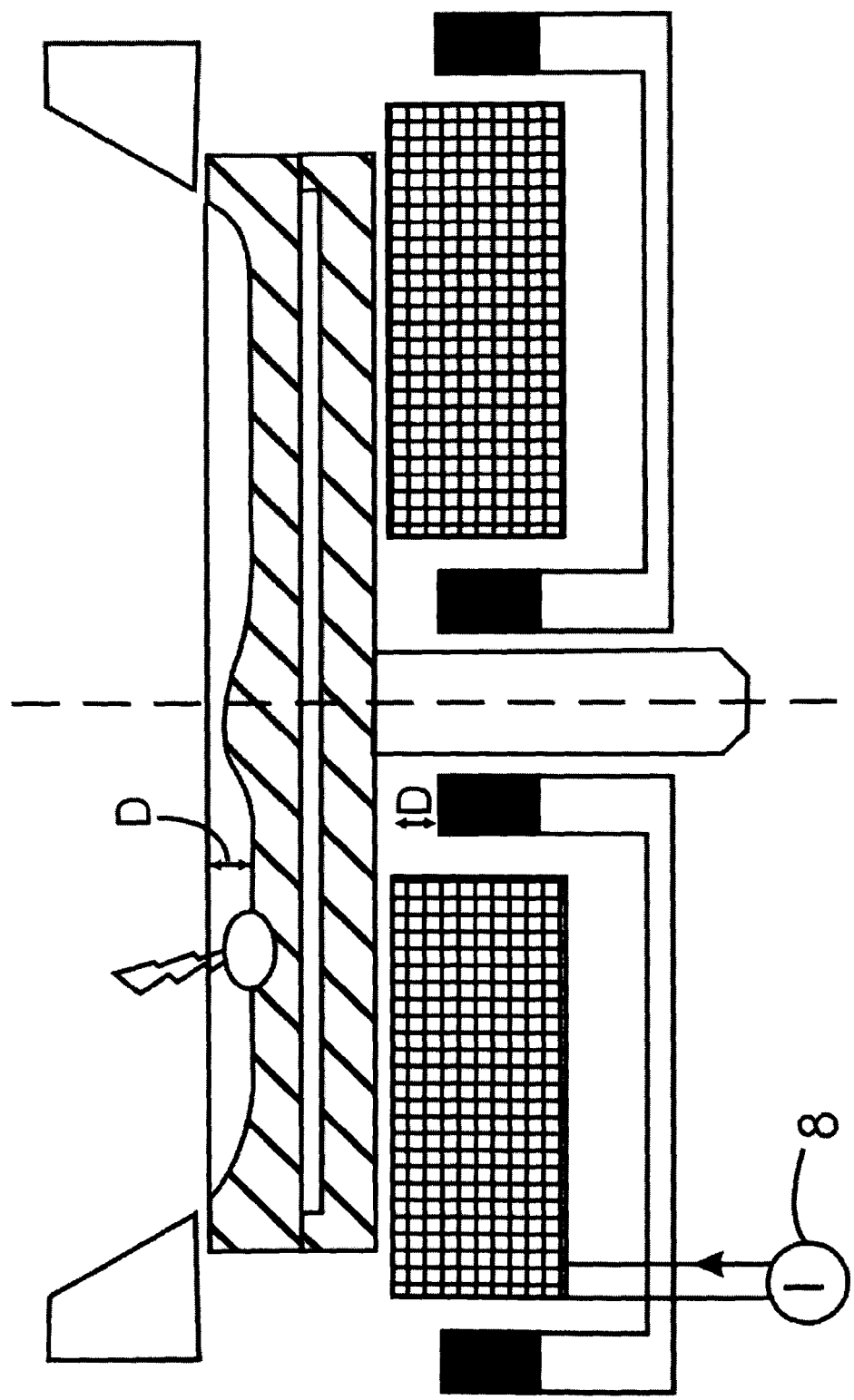

In order to compensate the process as described above, the magnet system is, according to the invention, withdrawn from the target according to the erosion depth in order to create essentially the initial state of a new target. A constant rate throughout the target's entire lifespan (target life) is thus essentially achieved. This is shown in FIG. 10, data line with rhomboidal symbols. FIG. 12 shows by comparison with FIG. 11, to clarify the situation, the erosion of the target by a thickness D and the permanent magnets accordingly displaced downwards.

Figure 13:
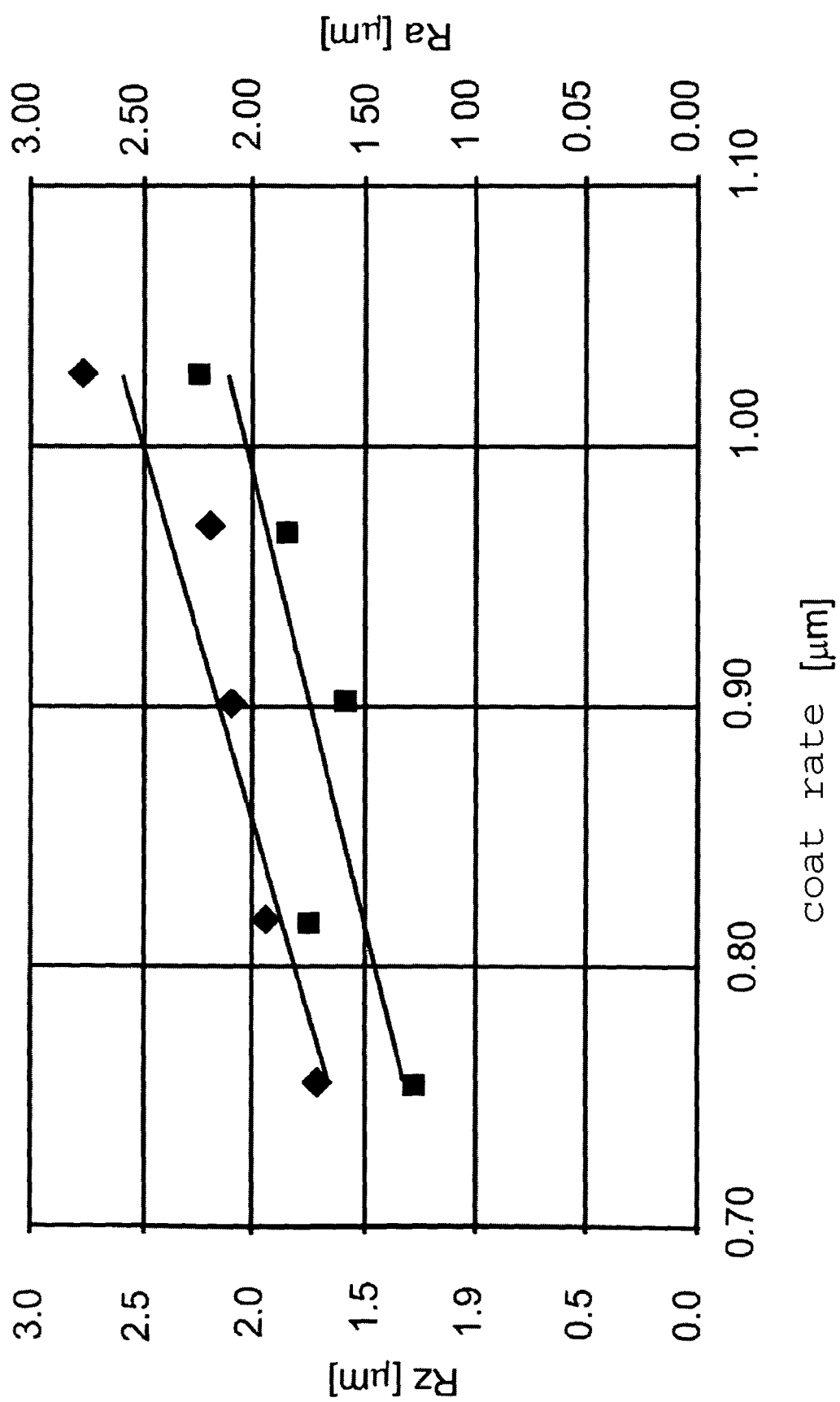

As already mentioned above, the emission of droplets (macro-particles) resp. the size of the emitted droplets will depend among others on the speed of the spark moving across the magnetic field (arc-steering). By suitably setting the position of the permanent magnets, the source can be adjusted between high rate and rough layer resp. lower rate and smoother layer. This is illustrated in FIG. 13, which shows the layer roughness (Rz, Ra) to be dependent on the coating rate set through the magnet system.

Figure 14:
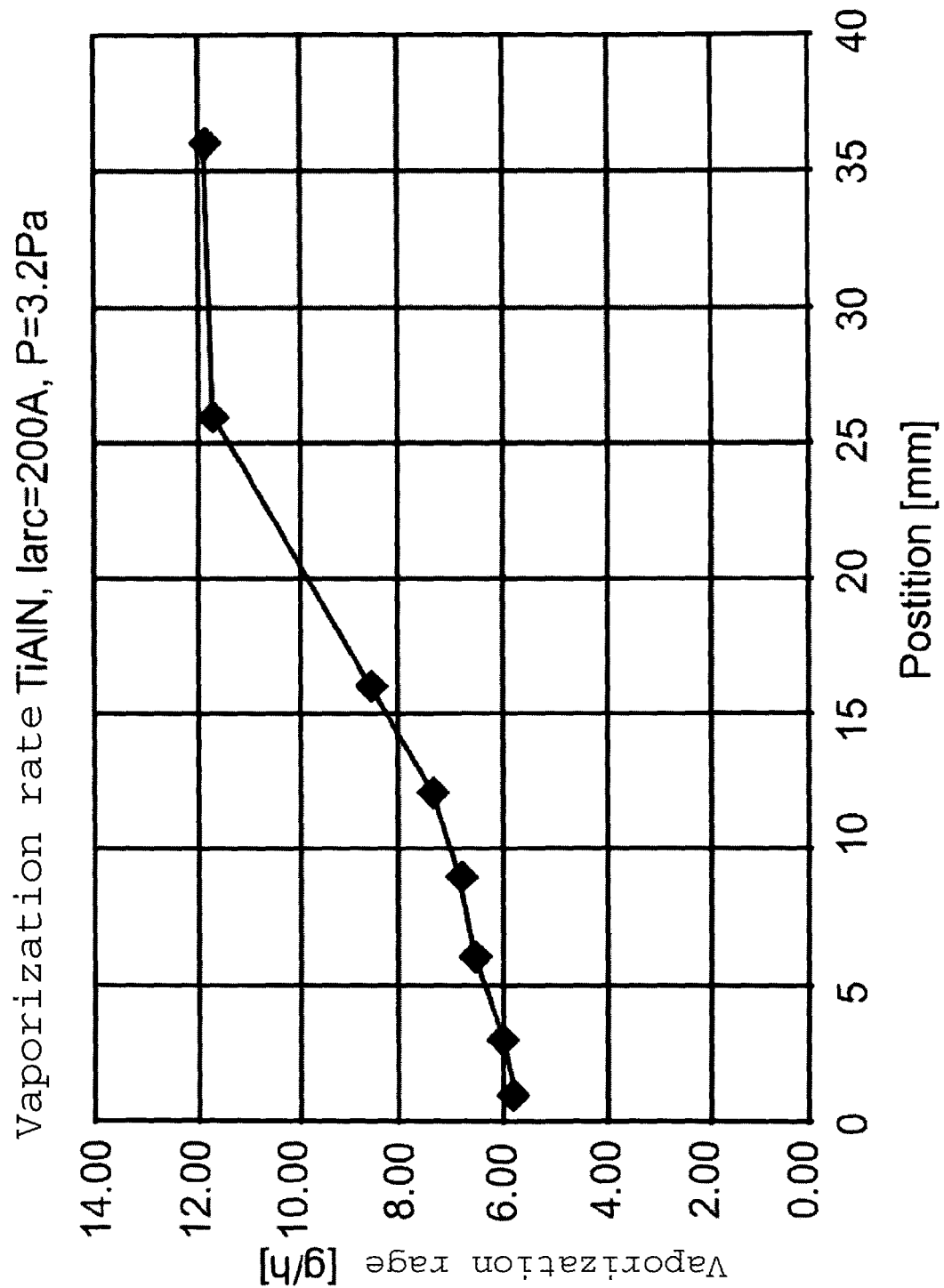

FIG. 14 additionally shows how the coating rate changes depending on the magnet position and thus how the rate can be set.

The repositioning of the permanent magnet thus results on the one hand in the constant vaporization rate and constant discharge voltage making the coating process more stable. Furthermore, the duration of the coating process, thanks to the constant rate for similar coatings, is almost the same regardless of the target age. By means of the inventive magnet system, it is also possible to select specifically different rates for different requirements, and layer characteristics, such as roughness and microstructure, can be fine-tuned.

Figure 15:
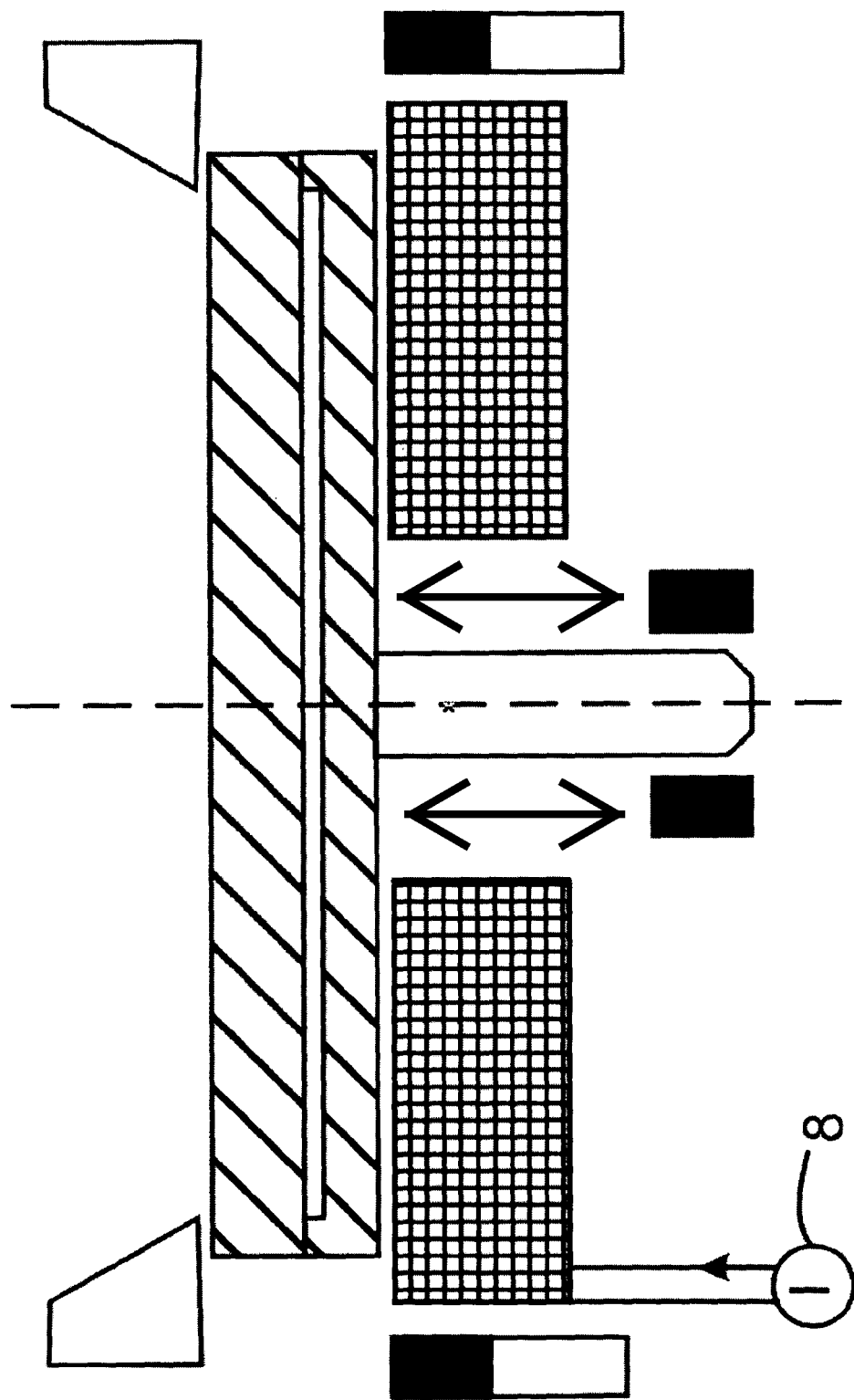

According to a further aspect of the present invention, the layer thickness distribution over the surface of the workpiece to be coated can be adjusted homogeneously. This is achieved by means of the inventive magnet system in one embodiment in such a manner that the inner permanent magnet can be removed from the target by about 50 mm regardless of the outer permanent magnet. The outer permanent magnet can also be displaced vertically to the target, preferably by several millimeters. This is shown in FIG. 15.

The coil current can be applied positive as well as negative, thus allowing the vaporization characteristic of the ARC source to be modified depending on the positivity or negativity of the coil current. This means the distribution characteristic can be adjusted.

What is claimed is:

1. ARC vaporization source with a magnetic field arrangement provided on a target comprising coating material for generating magnetic fields on and above a surface of the target, wherein the magnetic field arrangement comprises:
   marginal permanent magnets,
   a central permanent magnet, and
   at least one ring coil placed behind the target, whose inner diameter defined by windings has a diameter that is less than or equal to a diameter of the target, characterized in that the marginal permanent magnets and the central permanent magnet are displaceable away from the target perpendicularly to the surface of the target and a projection of the marginal permanent magnets onto the target surface is further away from a middle of the target surface than a projection of the ring coil onto the target surface, and the central permanent magnet is displaceable away from the target perpendicularly to the surface of the target independently of the marginal permanent magnets, wherein the marginal and central permanent magnets are adjustable to:

(a) a first setting at which the ARC vaporization source is configured to perform an ARC vaporization coating process, wherein the marginal and central permanent magnets take up a first position in which their poles are closest to the coating material, and in this first position the end of the pole of the marginal permanent magnet that is closest to the coating material, and the end of the pole of the central permanent magnet that is closest to the coating material, and the end of the ring coil that is closest to the coating material, lie in one plane, said first setting generating a magnetic field of 60-100 Gauss;

(b) a second setting at which the ARC vaporization source is configured to perform an ARC vaporization coating process, wherein the marginal and central permanent magnets take up a second position at a distance between 5 mm and 50 mm further from the target surface than the first position, wherein in this second position the end of the pole of the marginal permanent magnet which is closest to the coating material and the end of the pole of the central permanent magnet which is closest to the coating material are further far away from the target surface than the end of the ring coil which is closest to the coating material, said second setting generating a magnetic field of 10-40 Gauss; and (c) a third setting at which the ARC vaporization source is configured to perform an ARC vaporization coating process, wherein the marginal and central permanent magnets are separated from the ring coil, said third setting generating a magnetic field of 5-15 Gauss.

2. ARC vaporization source according to claim 1, characterized in that polarization of the marginal permanent magnets is the same for all.

3. ARC vaporization source according to claim 2, characterized in that, inside the ring coil, a central permanent magnet is provided with an opposite polarization to the polarization of the marginal permanent magnets.

4. ARC vaporization source according to claim 2, characterized in that the central permanent magnet is permanently connected over a connection leading through a magnetic flux with the marginal permanent magnets.

5. ARC vaporization installation with the ARC vaporization source according to claim 1.

6. ARC vaporization source according to claim 1, characterized in that the magnetic field arrangement is configured is such a manner that at the second setting of the magnetic field arrangement the position of the marginal and central permanent magnets are adjusted in such a manner that the pole of the marginal permanent magnet and the pole of the central permanent magnet are placed in one plane between the end of the ring coil which is closest to the coating material and the end of the end of the ring coil which is most far away from the coating material.

7. ARC vaporization source according to claim 1, characterized in that the magnetic field arrangement is configured is such a manner that at the second setting of the magnetic field arrangement the position of the marginal and central permanent magnets are adjusted in such a manner that the pole of the marginal permanent magnet and the pole of the central permanent magnet are placed in one plane more far away from the coating material than the end of the ring coil which is most far away from the coating material.

8. ARC vaporization source according to claim 1, characterized in that the ring coil is a permanently arranged coil.

9. ARC vaporization source according to claim 1, characterized in that the magnetic field arrangement is configured in such a manner that the central permanent magnet is removed far away from the target regardless of the marginal permanent magnet.

10. ARC vaporization source according to claim 9, characterized in that the magnetic field arrangement is configured is such a manner that at the third setting of the magnetic field arrangement the end of the pole of the central permanent magnet which is closest to the coating material is placed in one plane more far away from the coating material than the pole of the marginal permanent magnet which is closest to the coating material.

11. Method for coating substrates in an ARC vaporization installation with an ARC vaporization source according to claim 5, wherein during coating process the magnetic field arrangement is adjusted in such a way that the strength of the generated magnetic field is adjusted by adjusting the position of the central and marginal permanent magnets.

12. Method according to claim 11, wherein during coating process the central and marginal permanent magnets are adjusted in the first position at a distance from the coating material which leads to a generation of the magnetic field of 60-100 Gauss.

13. Method according to claim 11, wherein during coating process the central and marginal permanent magnets are adjusted in the second position at a distance from the coating material which leads to a generation of the magnetic field of 10-40 Gauss.

14. Method according to claim 11, wherein during coating process the central and marginal permanent magnets are adjusted in the second position at a distance from the coating material which leads to a generation of the magnetic field of 5-15 Gauss and the coil current is switched off.

* * * * *